(12) United States Patent
Yabe (10) Patent No.: US 7,525,828 B2
(45) Date of Patent: Apr. 28, 2009

(54) SEMICONDUCTOR MEMORY DEVICE AND REDUNDANCY METHOD THEREOF

(75) Inventor: Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/052,020

(22) Filed: Mar. 20, 2008

(65) Prior Publication Data

US 2008/0232148 A1 Sep. 25, 2008

(30) Foreign Application Priority Data

Mar. 23, 2007 (JP) ............................. 2007-077306

(51) Int. Cl.
*G11C 15/00* (2006.01)

(52) U.S. Cl. ..................... 365/49.1; 365/49.17; 365/200

(58) Field of Classification Search ............... 365/49.1, 365/49.17, 154, 156, 189.02, 189.09, 230.02
See application file for complete search history.

(56) References Cited

U.S. PATENT DOCUMENTS

| | | | | |
|---|---|---|---|---|
| 6,396,749 B2 * | 5/2002 | Al-Shamma et al. | ........ | 365/200 |
| 6,751,755 B1 * | 6/2004 | Sywyk et al. | .................. | 714/54 |
| 6,842,358 B2 * | 1/2005 | Khanna | ...................... | 365/49.1 |
| 6,903,953 B2 * | 6/2005 | Khanna | .................... | 365/49.17 |
| 7,173,837 B1 * | 2/2007 | Bettman et al. | .......... | 365/49.17 |
| 7,251,147 B1 * | 7/2007 | Maheshwari | ............. | 365/49.17 |
| 7,401,180 B1 * | 7/2008 | James et al. | ................. | 711/108 |

OTHER PUBLICATIONS

Kostas Pagiamtzis et al., "Content-Addressable Memory (CAM) Circuits and Architectures: A Tutorial and Survey", IEEE Journal of Solid-State Circuits, vol. 41, No. 3, pp. 712-727, Mar. 2006.
Hiroshi Ito et al., "Pure CMOS One-time Programmable Memory using Gate-Ox Anti-fuse", IEEE Custom Integrated Circuits Conference, pp. 469-472, 2004.

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A semiconductor memory device including a first memory to which a first address and first input data are input, and which outputs first output data, a content-addressable memory to which the first address is input as a search address, and which performs a search to determine whether or not the first address and a defective address coincide with each other and, when the first address and the defective address coincide with each other, outputs a second address and a control signal, a second memory which, when the second address is input thereto, outputs redundant data corresponding to the second address, and a multiplexer which, when the control signal is input thereto, switches the output data from the first output data to the redundant data, and outputs the redundant data to an input/output terminal.

20 Claims, 10 Drawing Sheets

SEMICONDUCTOR MEMORY DEVICE AND REDUNDANCY METHOD THEREOF

CROSS-REFERENCE TO RELATED APPLICATIONS

This application is based upon and claims the benefit of priority from prior Japanese Patent Application No. 200-077306, filed Mar. 23, 2007, the entire contents of which are incorporated herein by reference.

BACKGROUND OF THE INVENTION

1. Field of the Invention

The present invention relates to a semiconductor memory device and a redundancy method thereof, and is applied to, for example, a redundancy system and the like of a memory incorporated in a system LSI in a combined state.

2. Description of the Related Art

Heretofore, the capacity of a semiconductor memory device such as a static random access memory (SRAM) integrated into a system LSI tends to increase still more. On the other hand, in an SRAM or the like, redundancy for replacing a defective cell in a memory cell array with a redundant memory cell needs to be carried out. As a configuration for carrying out conventional redundancy, there is a configuration in which, for example, a spare row or the like including a redundant memory cell is provided in a memory cell array of an SRAM to be saved.

In the redundant memory cell of the spare row, a defective address of the SRAM (macro) to be saved, and replacement data thereof are stored. The defective address of the SRAM and the replacement data thereof are checked in advance by means of a tester, for example, in a functional test performed at the time of shipment.

Further, a row address included in externally input addresses (Add.) input to the SRAM is compared with a preprogrammed defective row address by an address comparator circuit provided in the SRAM. Subsequently, if the row address and the defective row address coincide with each other, then the row is replaced with any one of spare word lines (SWL) in the spare row to which any one of defective word lines (WL) corresponding to the defective row address is assigned.

However, in the conventional configuration, if it is tried to provide high-capacity redundancy, the area tends to increase.

This is because the defective word line (WL) of the cell array to be saved is replaced with one spare word line (SWL) as a unit, i.e., not with one memory cell as a unit, but with one word line (row) as a unit. With this configuration, not all the cells in the defective word line (WL) to be replaced are defective, and hence even cells which do not originally need to be replaced are replaced. Thus, all the cells connected to the word line (WL) are replaced, and replacement in units of one word (cell) cannot be performed.

For example, in the case of an SRAM provided with additional 64 spare rows for a memory cell array of 512 rows, the ratio of the area of the spare rows to that of the memory cell array is 12.5%. Further, even the ratio of the area of the spare rows to the entire SRAM (macro) area exceeds 10% leading to an area penalty. Thus, the area efficiency is remarkably low. As a result, when it is necessary to provide the high-capacity redundancy, the area efficiency is very low.

Furthermore, the spare rows and the address comparator circuit and the like constituting the redundancy are provided as hard intellectual property (IP) on the layout level. As a result, once the SRAM is designed, when, for example, it becomes necessary to obtain a macro in which the number of spare rows is reduced, and the area is also reduced due to an improvement in the manufacturing level of the factory, the time needed to redesign the spare rows tends to increase.

Examples of known documents relating to the invention of the present application are K. Pagiamtzis et al., "Content-Addressable Memory (CAM) Circuits and Architectures: A Tutorial and Survey", IEEE J. of Solid-State Circuits., vol. 41, No. 3, pp. 712-727, March 2006, and H. Ito et al., "Pure CMOS One-time Programmable Memory using Gate-Ox Anti-fuse", in CICC Tech. Dig., 2004, pp. 469-472H.

BRIEF SUMMARY OF THE INVENTION

A semiconductor memory device according to an aspect of the present invention comprising; a first memory to which a first address and first input data are input, and which outputs first output data; a content-addressable memory to which the first address is input as a search address, and which performs a search to determine whether or not the first address and a defective address coincide with each other and, when the first address and the defective address coincide with each other, outputs a second address and a control signal; a second memory which, when the second address is input thereto, outputs redundant data corresponding to the second address; and a multiplexer which, when the control signal is input thereto, switches the output data from the first output data to the redundant data, and outputs the redundant data to an input/output terminal.

A redundancy method of a semiconductor memory device according to an aspect of the present invention comprising; inputting a first address to a content-addressable memory as a search address; causing the content-addressable memory to perform a search to determine whether or not the input search address and a defective word address coincide with each other; causing the content-addressable memory, when the input search address and the defective word address coincide with each other, to output a second address to a second memory as an encoded address, and output a control signal to a multiplexer; causing the second memory to output redundant data corresponding to the input second address to the multiplexer; and causing the multiplexer which has received the control signal to switch the output data from first output data to the redundant data, and output the redundant data to an input/output terminal.

DETAILED DESCRIPTION OF THE INVENTION

Embodiments of the present invention will be described below with reference to the accompanying drawings. Incidentally, in the description, parts which are common throughout all the drawings will be denoted by common reference symbols.

First Embodiment

<1. Overall Configuration>

Figure 1:
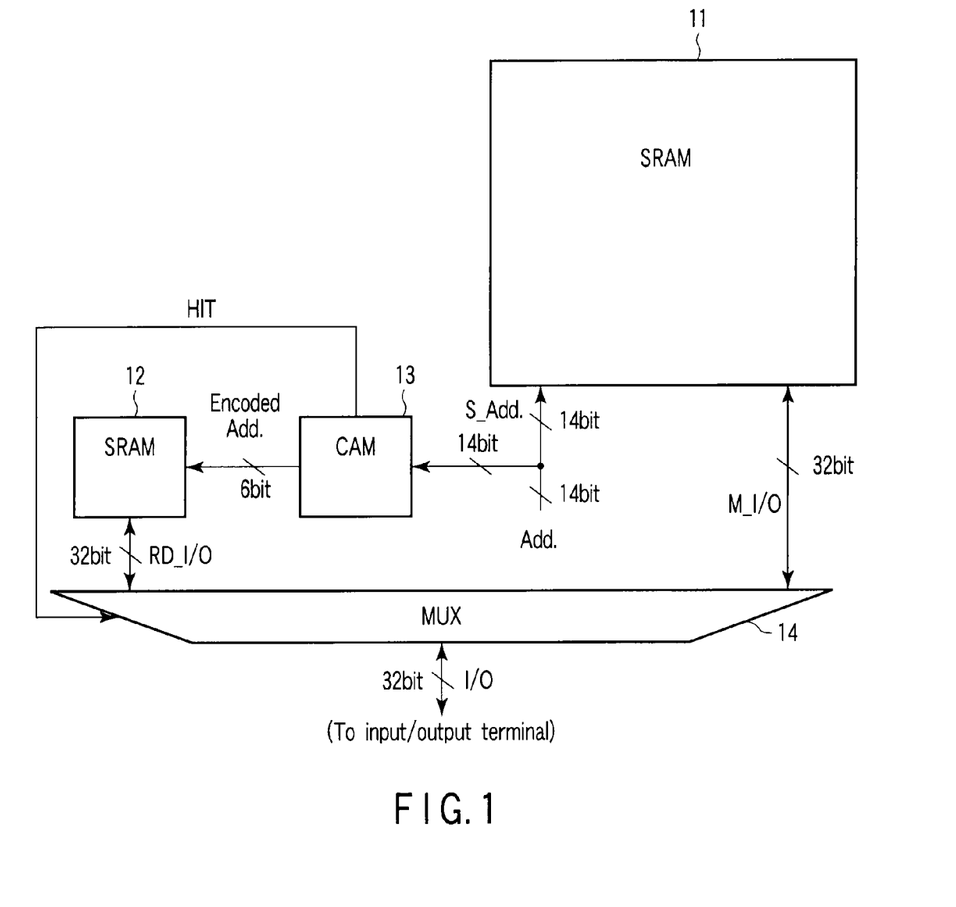
FIG. 1 is a block diagram showing a semiconductor memory device according to a first embodiment of the present invention.

First, the overall configuration of a semiconductor memory device according to a first embodiment of the present invention will be described below with reference to FIG. 1. FIG. 1 is a block diagram showing the semiconductor memory device according to the first embodiment.

As shown in FIG. 1, the semiconductor device according to this embodiment is constituted of an SRAM (first memory) 11, an SRAM (second memory) 12, a content-addressable memory (CAM) 13, and a multiplexer 14.

The SRAM (first memory) 11 is a memory macro which is an object to be saved when an redundancy operation is performed. The SRAM 11 receives an address (Add.) and input data (not shown) constituted of 14 bits input thereto, and outputs output data M_I/O constituted of 32 bits through the multiplexer 14.

The SRAM (second memory) 12 stores redundant data of the SRAM 11 in a redundancy memory cell. Upon receipt of a replacement address (Encoded Add.) constituted of 6 bits output from the content-addressable memory (CAM) 13, the SRAM 12 outputs redundant data RD_I/O corresponding to the replacement address (Encoded Add.).

The content-addressable memory (CAM) 13 stores a defective address in each entry (CAM memory cell). Further, an address (Add.) constituted of 14 bits is input to the CAM 13 as a search address (S_Add.), and the CAM 13 performs a search to determine whether or not the input search address S_Add. and the defective address stored in each entry coincide with each other. Subsequently, when, as a result of the search, the input search address S_Add. and the defective address coincide with each other, the CAM 13 transmits the replacement address (Encoded Add.) obtained by encoding the number of the entry with which the coincidence is obtained to the SRAM 12, and also transmits a control signal HIT to the multiplexer 14.

The multiplexer 14 selects one of the output data M_I/O and the replacement data RD_I/O by using the control signal HIT, and outputs the selected data as external output data I/O constituted of 32 bits.

<2. Each Configuration Example>

Next, configuration examples of the SRAM (first memory) 11, SRAM (second memory) 12, and CAM (content-addressable memory) 13 will be described below with reference to FIGS. 2 to 6.

<2-1. Configuration Example of First Memory (SRAM)>

Figure 2:
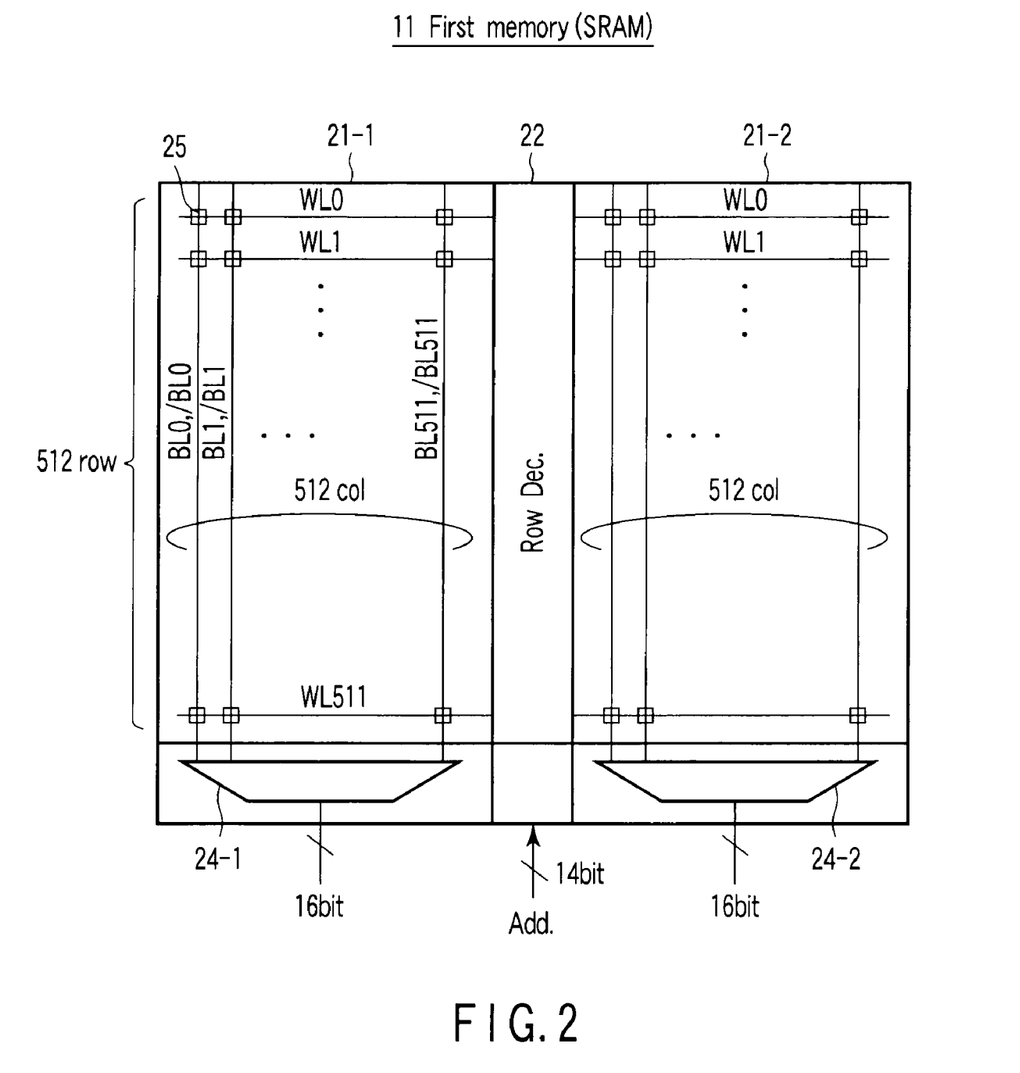
FIG. 2 is a block diagram showing a first memory (SRAM) according to the first embodiment.

As shown in FIG. 2, the first memory (SRAM) 11 is constituted of a memory cell arrays 21-1 and 21-2, a row decoder 22, and multiplexers 24-1 and 24-2, and is not provided with a spare row. The capacity of the SRAM 11 of this example is 512 Kb, and the word structure is 16 kiloword×32 bits.

The configuration of each of the memory cell arrays 21-1 and 21-2 is 512 (row)×1024 (col). That is, each of the memory cell arrays 21-1 and 21-2 is provided with a plurality of SRAM cells 25 arranged at intersection positions of word lines WL0 to WL511 and bit-line pairs BL0, /BL0 to BL511, /BL0511 in a matrix form.

The row decoder (Row Dec.) 22 decodes an input address (Add.) constituted of 14 bits.

Columns (bit-libe pair BL, /BL) of 1024 lines perform exchange of output data M_I/O constituted of 32 bits through the 32:1 multiplexers 24-1 and 24-2.

<Configuration Example of SRAM Cell>

Next, a configuration example of the SRAM cell 25 will be described below with reference to FIG. 3.

Figure 3:
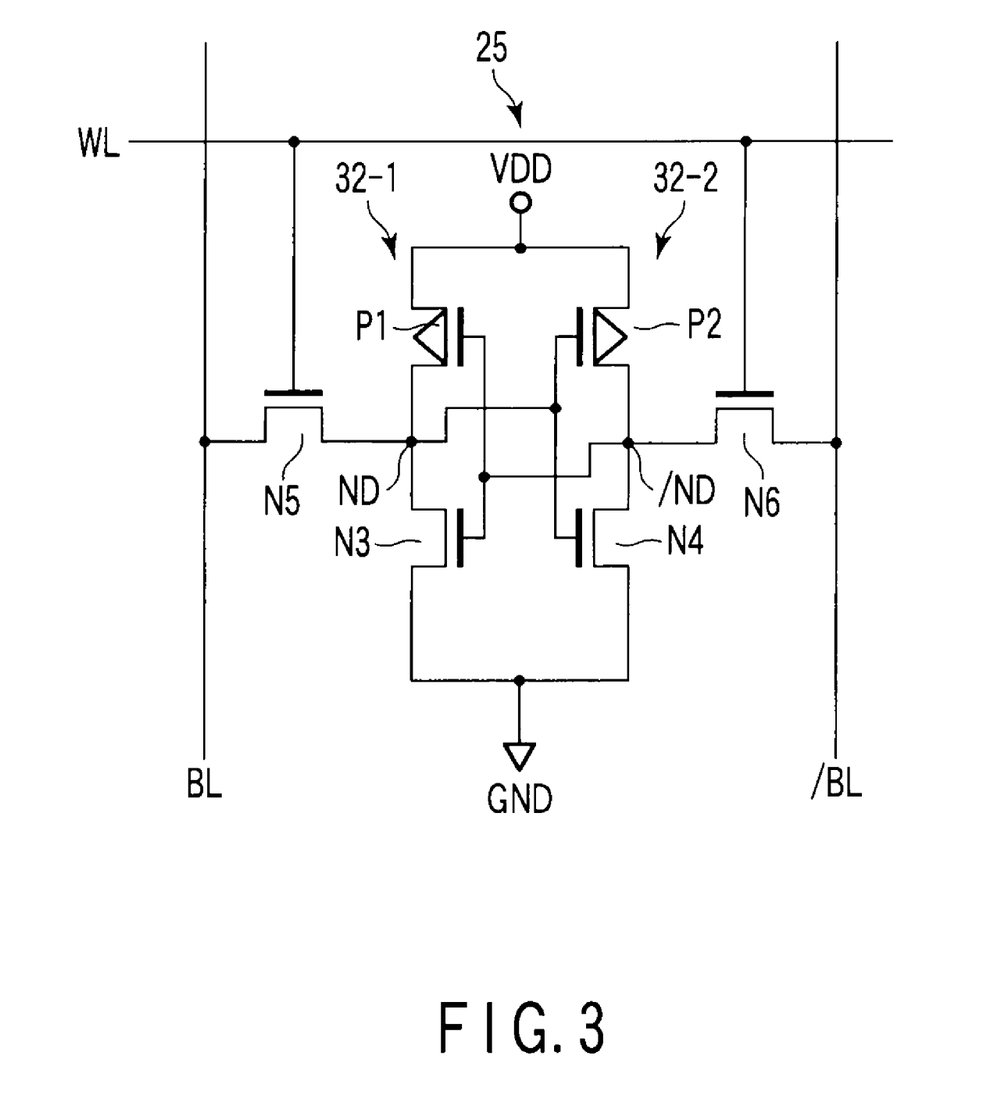
FIG. 3 is a circuit diagram showing an SRAM cell according to the first embodiment.

As shown in FIG. 3, the SRAm cell 25 is constituted of MOS transistors P1 to N6. The SRAM cell 25 is constituted of transfer transistors (Transfer Trs) N5 and N6, and inverter circuits 32-1 and 32-2 which are connected to each other to form a flip-flop for storing data.

One end of a current pathway of the transfer transistor N5 is connected to a bit line BL, the other end of the current pathway thereof is connected to a node ND of the inverter circuit 32-1, and a gate thereof is connected to a word line WL. One end of a current pathway of the transfer transistor N6 is connected to a bit line /BL, the other end of the current pathway thereof is connected to a node /ND of the inverter circuit 32-2, and a gate thereof is connected to the word line WL.

The inverter circuit 32-1 is provided with a load transistor (Load Tr or a pull-up Tr) P1, and a driver transistor (Driver Tr or a pull-down Tr) N3. One end of a current pathway of the driver transistor N3 is connected to a grounding power source terminal GND, the other end of the current pathway thereof is connected to one end of a current pathway of the load transistor PI at node ND, and a gate thereof is connected to a gate of the load transistor P1 and node /ND of the inverter circuit 32-2. The other end of the current pathway of the load transistor P1 is connected to an internal power source VDD.

<2-2. Configuration Example of Second Memory (SRAM)>

Next, a configuration example of the second memory (SRAM) 12 will be described below with reference to FIG. 4.

Figure 4:
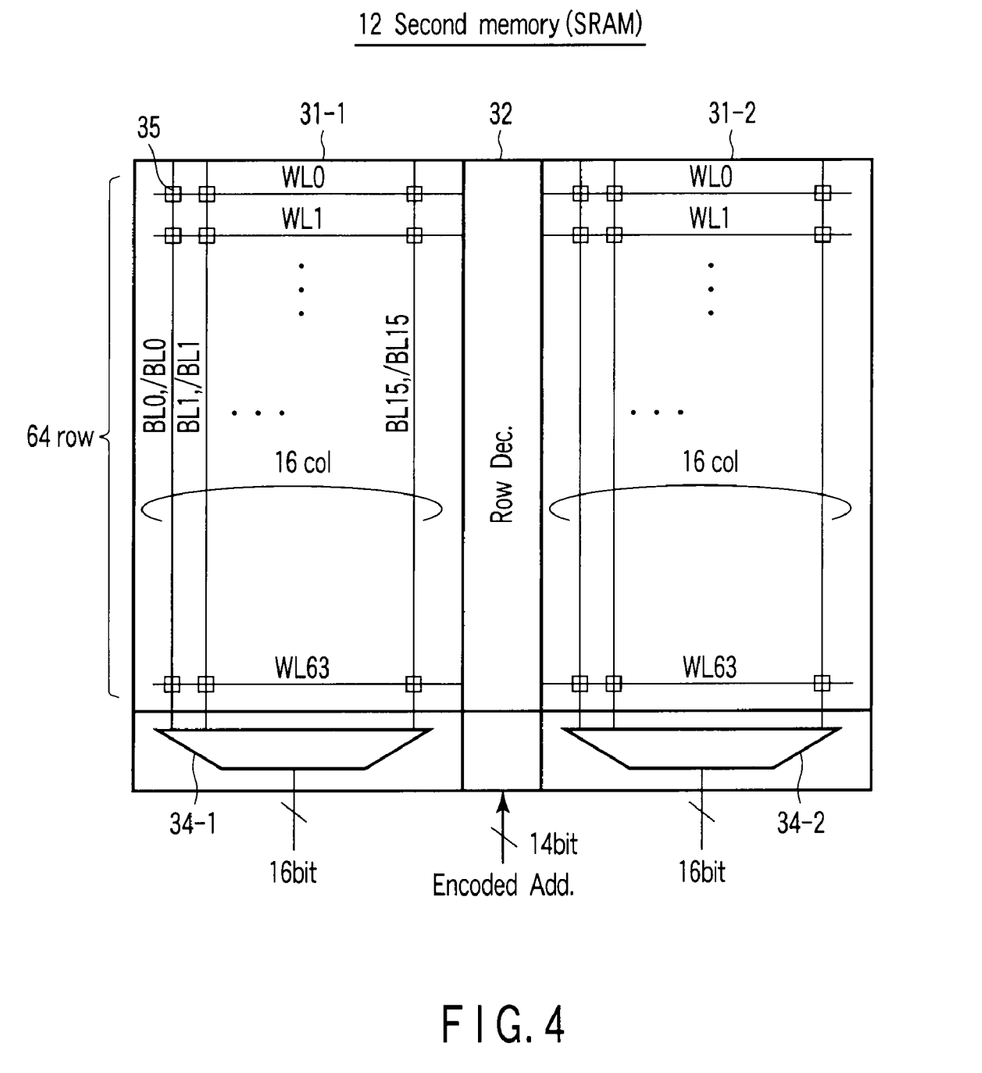
FIG. 4 is a block diagram showing a second memory (SRAM) according to the first embodiment.

As shown in FIG. 4, the SRAM 12 is, like the SRAM (first memory) 11, constituted of memory cell arrays 31-1 and 31-2, a row decoder 32, and multiplexers 34-1 and 34-2. The capacity of the second memory (SRAM) 12 is smaller than that of the first memory (SRAM) 11, and is 2 Kb in this example.

Each of the memory cell arrays 31-1 and 31-2 is provided with a configuration of 64 (row)×32 (col), i.e., word lines WL0 to WL63 and bit-line pairs BL0, /BL0 to BL15, /BL15. Each of the memory cell arrays 31-1 and 31-2 is provided with redundant memory cells 35 at intersection positions of the word lines and the bit-line pairs.

In the redundant memory cells 35, redundant data corresponding to an encoded address (Encoded Add.) constituted of 6 bits input to the row decoder 32 is stored. In the case of this example, the configuration of the redundant memory cell 35 is identical with the SRAM cell 25 shown in FIG. 3.

Multiplexers 34-1 and 34-2 each output redundant data RD_I/O constituted of 16 bits to a multiplexer 14.

<2-3. Configuration Example of Content-Addressable Memory (CAM)>

Next, a configuration example of the content-addressable memory (CAM) 13 will be described below with reference to FIG. 5.

Figure 5:
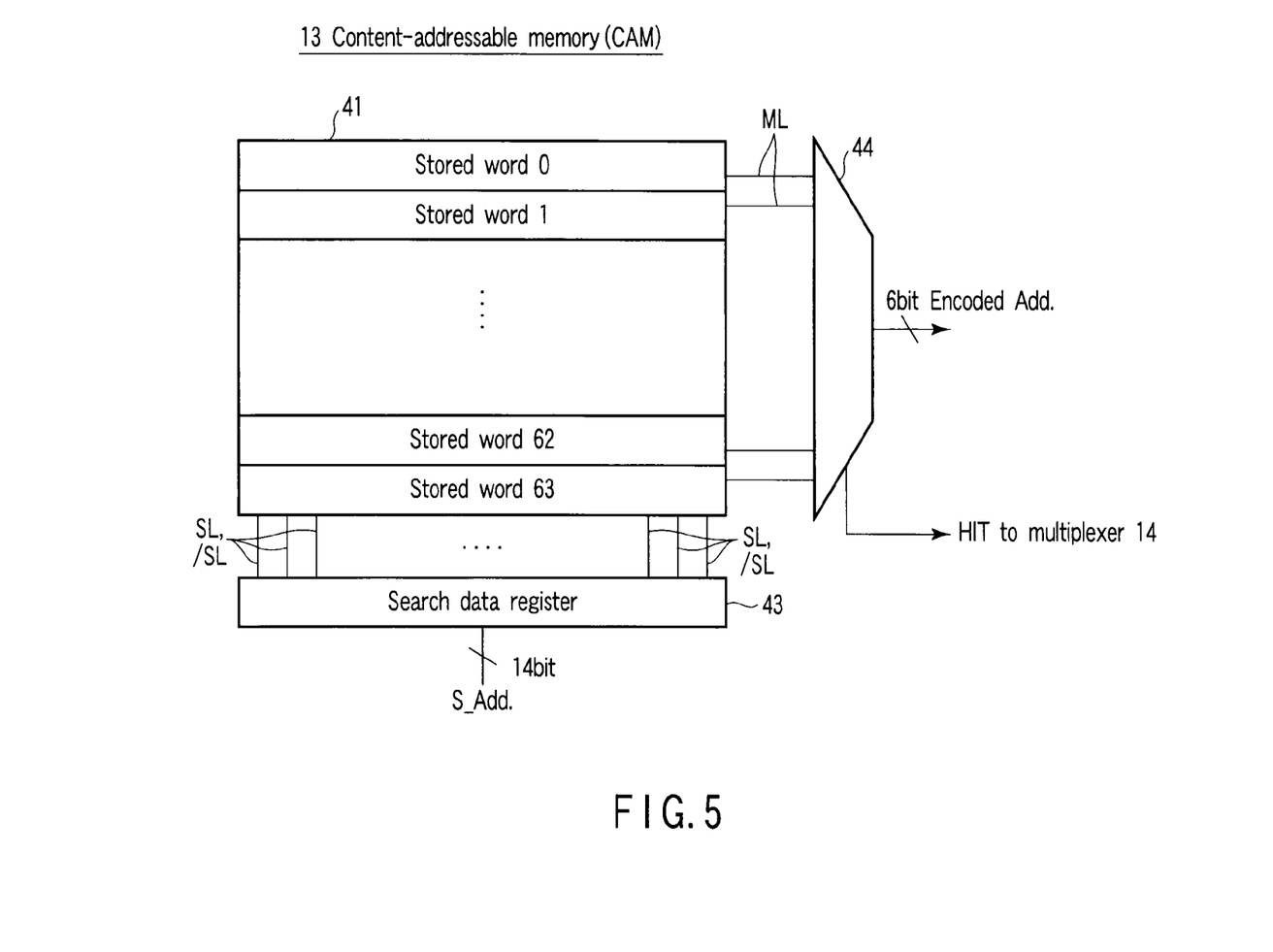
FIG. 5 is a block diagram showing a content-addressable memory (CAM) according to the first embodiment.

As shown in FIG. 5, the CAM 13 is constituted of a memory cell array 41, a search data register 43, and a multiplexer 44.

The memory cell array 41 is provided with a plurality of CAM memory cells (entries) each storing a defective address (not shown) at intersection positions of the word lines and the bit-line pairs. In the case of this example, the memory cell array 41 is provided with a configuration of 64 entries×15 bits, and stores a maximum of 64 sets of an address (14 bits) of a defective word of the first memory (SRAM) 11 and an entry validating flag (1 bit), both totalling 15 bits, and the capacity thereof is 960 bits. Further, the match lines ML are shared by the CAM memory cells of the respective rows, and the search line pairs SL, /SL are shared by the CAM memory cells of the respective columns.

A defective address stored in a CAM memory cell CMC is, when it coincides with a search address (S_Add.) of 14 bits input to the search line pair SL, and /SL through the search data register 43, output to the outside by the match line ML through the multiplexer 44 for each stored word (Stored word 0 to Stored word 63). In the case of this example, a defective address constituted of 32 bits is stored in each of the stored words (Stored word 0 to Stored word 63).

<Configuration Example of CAM Memory Cell (Entry) CMC>

Next, a configuration example of a NOR CAM memory cell (entry) CMC according to this example will be described below with reference to FIG. 6.

Figure 6:
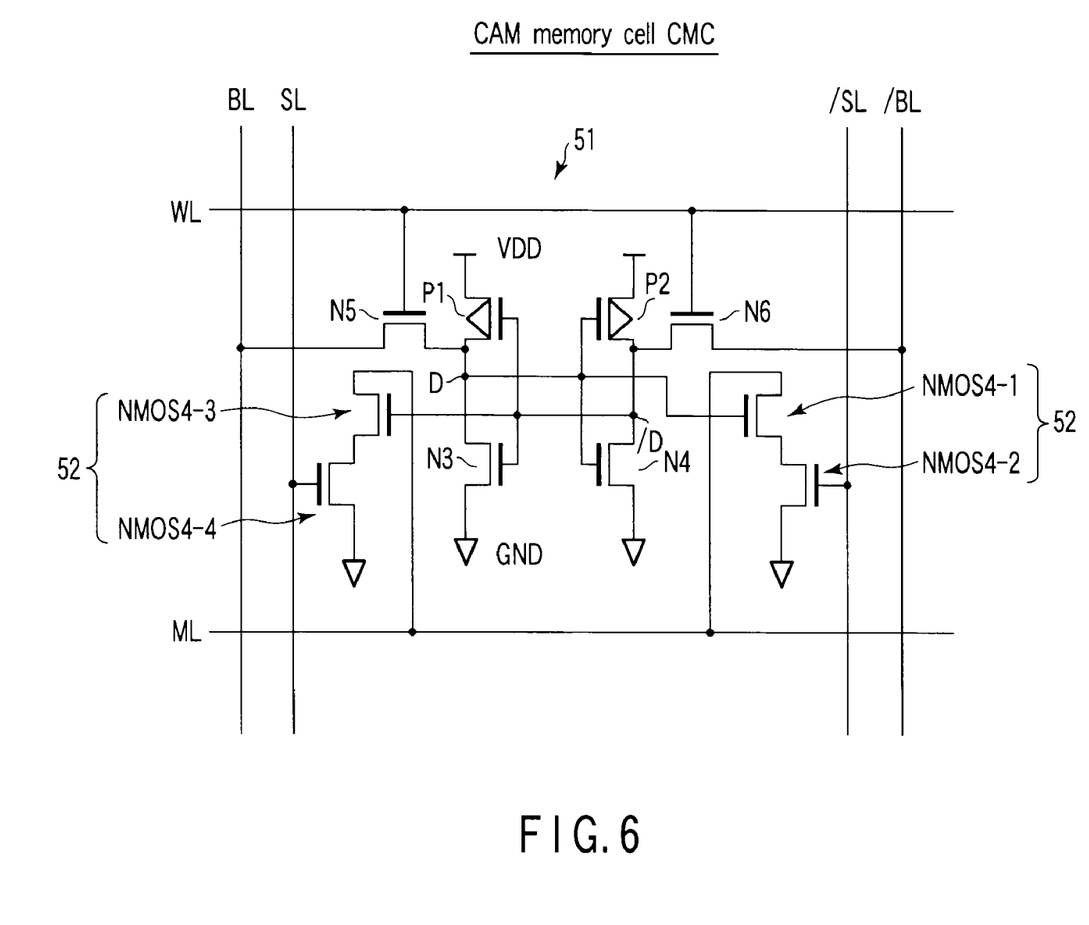
FIG. 6 is a circuit diagram showing a CAM memory cell according to the first embodiment.

As shown in FIG. 6, the CAM memory cell CMC is provided at each of intersection positions of word lines WL and bit-line pairs BL, /BL each functioning as a random access port, and is constituted of a data holding section 51 and a comparison section 52. Each CAM memory cell CMC outputs, when data on the search line pair SL, /SL and the stored data coincide with each other, "1" on the match line ML, and outputs "0" when they do not coincide with each other.

The data holding section 51 is provided at a position of intersection of the word line W1 and the bit-line pair BL, /BL, and is configured to hold a defective address. The data holding section 51 is constituted of, like the SRAM cell, MOS transistors P1 to N6.

That is, one end of a current pathway of a transfer transistor N5 is connected to the bit-line BL, the other end of the current pathway thereof is connected to a node D of an inverter circuit, and a gate thereof is connected to the word line WL. One end of a current pathway of a transfer transistor N6 is connected to the bit-line /BL, the other end of the current pathway thereof is connected to a node /D of an inverter circuit, and a gate thereof is connected to the word line WL. One end of a current pathway of a driver transistor N3 is connected to a grounding power source terminal GND, the other end of the current pathway thereof is connected to one end of a current pathway of a load transistor P1 at node D, and a gate thereof is connected to a gate of the load transistor P1 and a node /D. The other end of the current pathway of the load transistor P1 is connected to an internal power source VDD.

One end of a current pathway of a driver transistor N4 is connected to a grounding power source terminal GND, the other end of the current pathway thereof is connected to one end of a current pathway of a load transistor P2 at node /D, and a gate thereof is connected to a gate of the load transistor P2 and a node D of an inverter circuit 32-1. The other end of the current pathway of the load transistor P2 is connected to the internal power source VDD.

The comparison section 52 is constituted of NMOS transistors NMOS4-1 to NMOS4-4. A gate of the NMOS transistor NMOS 4-1 is connected to node D, one end of a current pathway thereof is connected to the match line, and the other end of the current pathway thereof is connected one end of a current pathway of the NMOS transistor NMOS4-2. A gate of the NMOS transistor NMOS4-2 is connected the search line /SL, and the other end of the current pathway thereof is connected to the grounding power source terminal GND. A gate of the NMOS transistor NMOS 4-3 is connected to node /D, one end of a current pathway thereof is connected to the match line ML, and the other end of the current pathway thereof is connected to one end of a current pathway of the NMOS transistor NMOS4-4. A gate of the NMOS transistor NMOS 4-4 is connected to the search line SL, and the other end of the current pathway thereof is connected to the grounding power source terminal GND.

<Search Operation of Content-Addressable Memory (CAM)>

Next, a search operation of the content-addressable memory (CAM) will be described below.

First, defective word addresses of a maximum of 64 entries are written to each of the rows (Stored word 0 to stored word 63) of the memory cell array 41. The defective word addresses are those data items preprogrammed in an external memory written to the CAM memory cells CMC through the word lines WL and bit-line pairs BL, /BL functioning as random access ports immediately after the turning-on of the power. The external memory is, for example, a metal fuse, an electric fuse or the like.

Further, in each of rows to which the defective word addresses are written, for example, "1" indicating an activated state is written to an entry validating flag at the same time, thereby making the row an object of the search operation.

Subsequently, the search operation is performed. First, it is determined whether or not a search address S_Add. (search word address) of, for example, 14 bits input from outside the CAM memory cell CMC and the defective address stored in the CMC memory cell CMC coincide with each other.

For example, it is assumed that "1" data is stored in the CAM memory cell CMC. In this case, node D in FIG. 6 is "1" (D="1"), and node /D is "0" (/D="0"). Here, when in a column including this CAM memory cell CMC, data "0" is searched for, the search lines SL and /SL are biased in such a manner that the search line SL becomes "0" (SL="0") and the search line /SL becomes "1" (/SL="1").

Subsequently, the match line ML is lowered from the initial state where it is charged in advance to "1" to "0" through the transistors NMOS4-1 to NMOS4-4.

On the other hand, when data "1" is searched for, the search lines SL and /SL are biased in such a manner that the search line SL becomes "1" (SL="1") and the search line /SL becomes "0" (/SL="0"). There is no current pathway for lowering the match line ML to "0" through the transistors NMOS4-1 to NMOS4-4. Accordingly, the match line ML is maintained in the state where it is charged in advance to "1".

As described above, each CAM memory cell CMC outputs "1" when the data on the search line pair SL and /SL and the stored data coincide with each other, and outputs "0" when these data items do not coincide with each other. Furthermore, the match line ML is shared by the memory cells of the respective rows. For this reason, only when all the stored address bits of 14 bits coincide with the data on the search line pair SL and /SL in each row, the match line ML becomes "1", and becomes "0" in the other cases.

When a CAM memory cell (entry) with which data coincidence is obtained is present, a hit signal HIT of the data "1" is output, the number of entry of the hit is encoded at the same time, and the encoded number is output to the second memory 12 as an encoded address (encoded Add.). For example, when the stored word 1 (Stored word 1) in FIG. 5 is of the hit, an encoded address (encoded Add.) "000001" is output to the second memory 12.

<3. Redundancy Operation (Read Time)>

Figure 7:
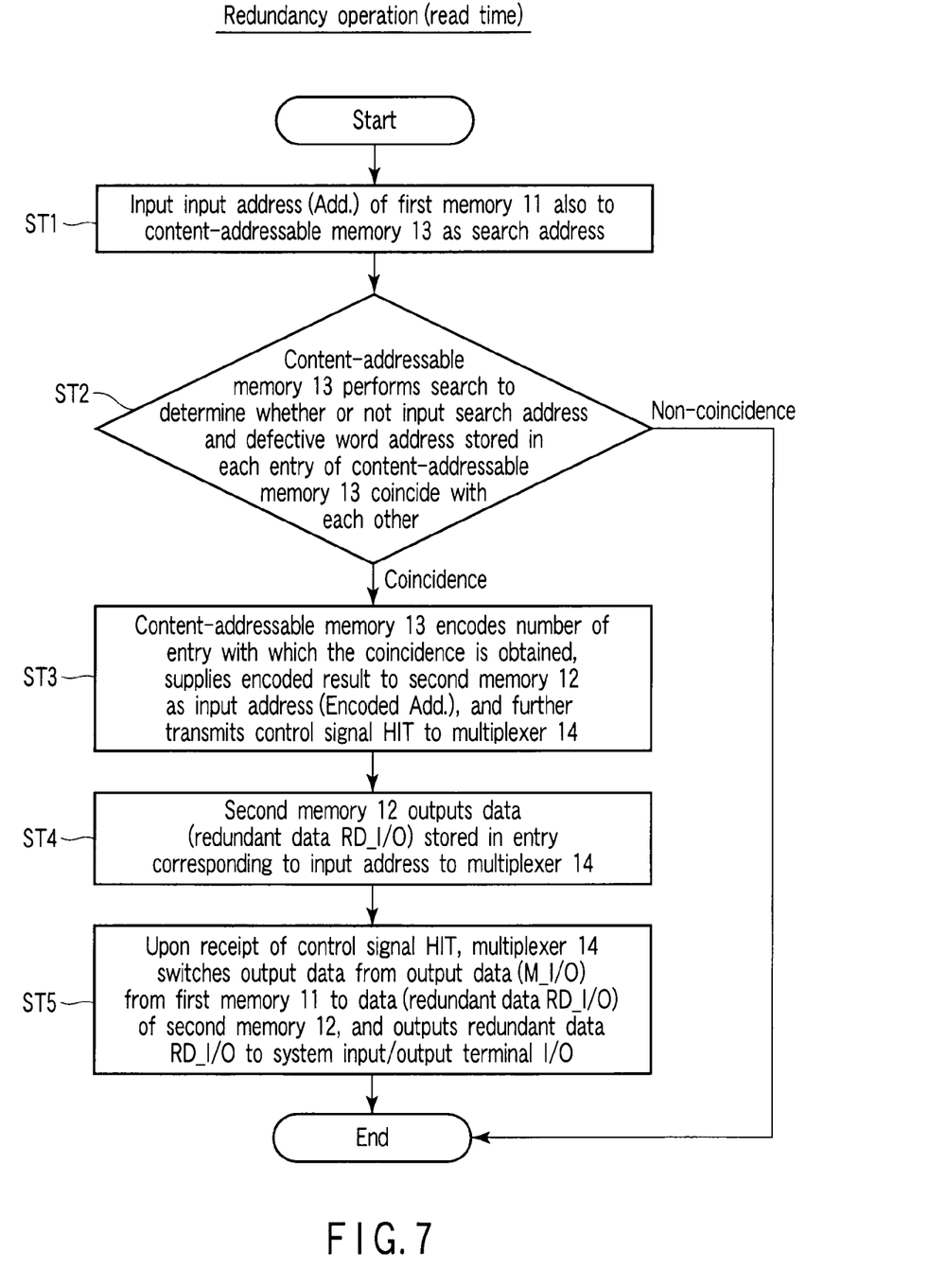
FIG. 7 is flowchart showing a redundancy operation of the semiconductor memory device according to the first embodiment.

Next, a redundancy operation of the semiconductor memory device according to this example will be described below on the basis of FIG. 7. In the following, a description will be given by taking the redundancy operation performed at the time of reading (Read time) the first memory (SRAM) 11 as an example.

(Step ST1)

First, as shown in FIG. 1, an input address (Add.) of the first memory (SRAM) 11 is also input to the content-addressable memory (CAM) 13 as a search address. This input address (Add.) is, in the case of this example, 14 bits.

(Step ST2 (Defective Address Search))

Subsequently, the content-addressable memory (CAM) 13 performs the defective address search to determine whether or not the input address (Add.) and the defective address coincide with each other. That is, the content-addressable memory (CAM) 13 performs search to determine whether or not the input search address (Add.) and the defective word address stored in each entry (CAM memory cell CMC) of the content-addressable memory (CAM) 13 coincide with each other.

Subsequently, when coincidence is not obtained, the redundancy operation for this input address is terminated.

On the other hand, when coincidence is obtained, the flow advances to the next step ST3.

(Step ST3)

Subsequently, the content-addressable memory (CAM) 13 encodes the number of the entry with which the coincidence is obtained, supplies the encoded result to the second memory (SRAM) 12 as an input address (Encoded Add.), and further transmits a control signal HIT to the multiplexer 14.

(Step ST4)

Subsequently, the second memory (SRAM) 12 outputs redundant data RD_I/O stored in an entry (CAM memory cell CMC) corresponding to the input address to the multiplexer 14.

(Step ST5)

Subsequently, upon receipt of the control signal HIT, the multiplexer 14 switches the output data from the output data M_I/O of the first memory (SRAM) 11 to the redundant data RD_I/O of the second memory (SRAM) 12, and outputs the redundant data RD_I/O to the system input/output terminal I/O.

When the input address and the defective address coincide with each other as described above, the redundant data RD_I/O from the second memory (2-Kb SRAM) is output in place of the output data M_I/O of the first memory (512-Kb SRAM), thereby performing the redundancy operation.

<4. Redundancy Operation (Write Time)>

Incidentally, in the redundancy operation of this example, the redundancy operation performed at the time of reading data (Read time) from the first memory 11 has been described as an example. However, a redundancy operation to be performed at the time of writing data (Write time) to the first memory 11 can also be performed in the same manner. That is, at the Write time, when the search address input to the content-addressable memory (CAM) 13 and the defective address coincide with each other, redundant word data stored in the second memory (2-Kb SRAM) 12 is written to the first memory (512-Kb SRAM macro) 11.

<5. Effect of Present Embodiment>

With the semiconductor memory device according to this embodiment and the redundancy method thereof, at least the following effects (1 and 2) can be obtained.

(1) Even when high-capacity redundancy is provided, the area can be prevented from becoming large.

In order to obtain effect 1 described above, in this example, a semiconductor memory device comprising a first memory 11 to which a first address Add. and first input data are input, and which outputs first output data M_I/O, a content-addressable memory (CAM) 13 to which the first address Add. is input as a search address, and which performs a search to determine whether or not the first address and a defective address coincide with each other and, when the first address and the defective address coincide with each other, outputs a second address (Encoded Add.) and a control signal HIT, a second memory 12 which, when the second address is input thereto, outputs redundant data RD_I/O corresponding to the second address, and a multiplexer 14 which, when the control signal HIT is input thereto, switches the output data from the first output data to the redundant data to thereby output the redundant data to the input/output terminal is proposed.

With the configuration described above, it is possible to replace the defective data of the first memory 11 to be saved in units of one word. This makes it unnecessary to replace even cells which do not originally need to be replaced unlike the comparative example or the like in which replacement is performed in units of one defective word line. As a result of this, even when high-capacity redundancy is provided in the device, the area can be prevented from being increased.

For example, in this example, an example in which the first memory 11 is a 512-Kb SRAM macro, the content-addressable memory 13 is a 960 b CAM macro, and the second memory 12 is a 2-Kb SRAM macro has been described. In this case, the area ratios of the respective macros are approximately 100:4:2. Thus, the area penalty occupied by the 960 b CAM macro as the content-addressable memory 13 and the 2-Kb SRAM macro as the second memory 12 is about 6%. Further, even in consideration of the area of the multiplexer 14, it is possible to make the area penalty of the overall circuit equal to or less than 10%.

On the other hand, in the comparative example to be described later, 64 spare rows for redundancy are provided with respect to a memory cell array of 512 rows. In this case, the ratio of the spare rows in area to the memory cell array is 12.5%. Further, even in terms of the ratio of the spare rows in area to the overall area of the SRAM (macro), the area penalty of the spare rows exceeds 10%. As described above, when it is assumed that the defective data is saved in units of one word, for example, 64 spare rows are used to save the defective cells of 64 bits (64×1024=64 Kb), and hence the area efficiency is remarkably low.

In contrast, in this example, defective data can be saved in units of one word, and the spare memory cells are provided not in units of a cell array of a 512-Kb macro but in units of one word of a macro, and hence the number of the additional memory cells can be reduced, and the area can be prevented from increasing.

More specifically, the case of this example corresponds to adding spare memory cells of 64 words×32=2 Kb to the second memory cell 12. To put it the other way around, this example corresponds not to adding all the spare memory cells of 64 Kb to be connected to the word lines, but to providing only the spare memory (redundant memory) of 64×32=2 Kb for 32 columns actually including defective cells selected by the multiplexer (32:1 MUX) 14 in the second memory (2-Kb SRAM macro) 12. As described above, defective data can be saved in units of one word, which is advantageous in that the redundancy can be constituted by using a small area penalty.

(2) Even when a change in the design occurs, the design time can be reduced.

In the configuration of this example, the second memory 12 in which the spare memory (redundant memory) is stored, and the content-addressable memory 13 in which the defective addresses are stored are separately provided independent of each other. In other words, the spare memory (redundant memory) and the defective addresses are not provided on the layout level as the hard IP (intellectual property) of the lower level design in the SRAM (macro) to be saved, unlike the spare rows according to the comparative example. Accordingly, even when the spare memory (redundant memory) needs to be redesigned due to, for example, an improvement or the like in the manufacturing level of the factory, after once the first memory (SRAM) 11 to be saved is designed, it is necessary to redesign only the second memory 12 and the content-addressable memory 13. As a result, even when a change in design occurs, the design time can be reduced.

As described above, as for the second memory 12 and the content-addressable memory 13 according to this example, the compilable macro for automatically synthesizing a memory having arbitrary capacity and an arbitrary word structure can be used, and hence it is possible to provide the entire system shown in FIG. 1 as soft IP of the RTL level which is the higher level design.

This is advantageous in that a system in which the redundancy capacity is reduced due to an improvement in the manufacturing level of the factory, for example, a system or the like in which the saving set is reduced from 64 entries to 32 entries can designed in a short period of time.

Second Embodiment (Example in which CAM Memory Cell is Further Provided with Program Section)

Next, a semiconductor memory device according to a second embodiment will be described below with reference to FIG. 8.

This embodiment relates to a configuration example in which a CAM memory cell is further provided with a program section. In this description, a detailed description of parts overlapping those of the first embodiment will be omitted.

Figure 8:
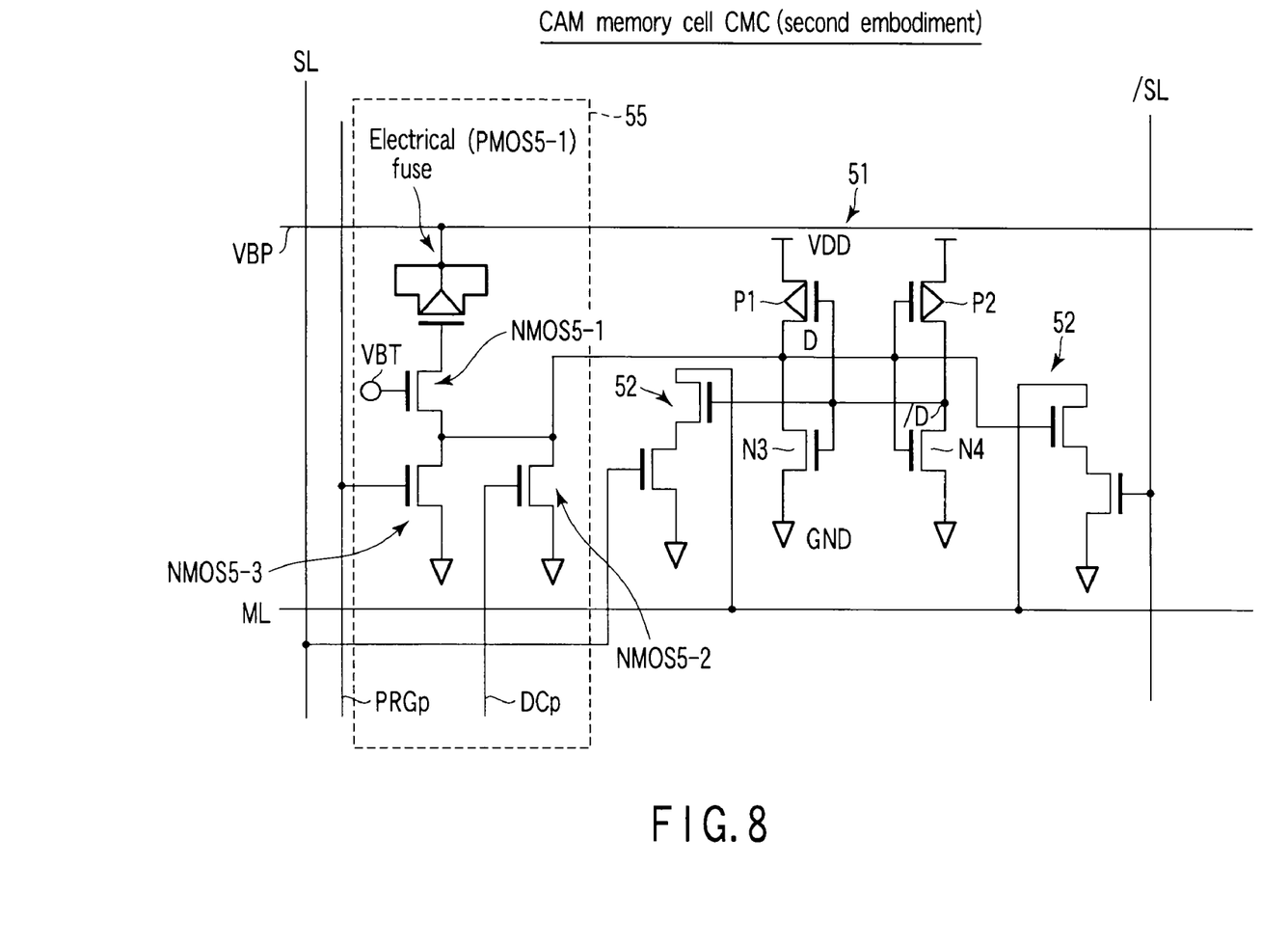
FIG. 8 is a circuit diagram showing a CAM memory cell according to a second embodiment of the present invention.

As shown in FIG. 8, the semiconductor memory device according to this example differs from the first embodiment in that a CAM memory cell CMC is further provided with a program section 55.

The program section 55 is constituted of an electrical fuse (PMOS5-1), a transistor NMOS5-1 (protection transistor), a transistor NMOS5-2, and a transistor NMOS5-3.

In the case of this example, as the electrical fuse, the PMOS gate insulating film breakdown type electrical fuse (PMOS5-1) is utilized. A gate of the fuse PMOS5-1 is connected to one end of a current pathway of the transistor NMOS5-1, one end and the other end of a current pathway of the fuse PMOS5-1 are connected to a program interconnect line VBP.

A gate of the transistor NMOS5-1 (protection transistor) is connected to a program node VBT, the other end of the current pathway thereof is connected to one end of a current pathway of each of the transistors NMOS5-2 and NMOS5-3. This protection transistor NMOS5-1 is a transistor for protecting the other transistors NMOS5-2 and NMOS5-3 against a high program power source voltage generated when the electrical fuse is programmed.

A gate of the transistor NMOS5-2 is connected to a program interconnect line DCp, and the other end of the current pathway thereof is connected to the grounding power source terminal GND.

A gate of the transistor NMOS5-3 is connected to a program interconnect line PRGP, and the other end of the current pathway thereof is connected to the grounding power source terminal GND.

<Program Operation>

Next, a program operation of the program section 55 will be described below.

First, a program operation to be performed when it is desired to write data "0" to the electrical fuse (PMOS5-1) will be described below. In this case, the program operation is performed by breaking the gate insulating film of the electrical fuse (PMOS5-1) to thereby bring the current pathway of the transistor PMOS5-1 into a conduction state.

First, in a state where the voltage of the internal power source VDD of the data holding section 51 is fixed at the VSS level, the program interconnect line PRGp is biased to "1", and the program interconnect line VBP is biased to the program power source voltage. The program power source voltage is, when the gate oxide film thickness of the fuse element PMOS5-1 is about 1.8 nm in the 90 nm process, about 7.0 V.

At this time, the gate voltage of the transistor NMOS5-1 (protection transistor) is set at about 2.4 V which is applied to the program node VBT, and the program interconnect line DCp is biased to "0". Then, the gate of the electrical fuse (PMOS5-1) is biased to about 0 V through the transistors NMOS5-1 and NMOS5-3. As a result, the program power source voltage is applied to the gate insulating film of the electrical fuse PMOS5-1 so as to break the gate insulating film and bring the current pathway of the transistor PMOS5-1 into the conduction state, thereby writing data "0" to the electrical fuse (PMOS5-1).

Subsequently, a program operation to be performed when it is desired to write data "1" to the electrical fuse (PMOS5-1) will be described below.

In this case, the program operation is performed by bringing the current pathway of the transistor PMOS5-1 into a non-conduction state without breaking the gate insulating film of the electrical fuse (PMOS5-1).

First, the program interconnect line PRGp is biased to "0". As a result of this, the voltage state of the gate of the electrical fuse (PMOS5-1) is brought into a floating state, the gate insulating film is prevented from being broken, and the data "1" is written to the electrical fuse (PMOS5-1).

Incidentally, the program interconnect line VBP is, in the memory cell array 41 of the content-addressable memory 13, shared by the CAM memory cells CMC of the same row. Each of the program interconnect lines PRGp and DCp is, in the memory cell array 41 of the content-addressable memory 13, shared by the CAM memory cells CMC of the same column. For this reason, the program interconnect line VBP of the row to which data is to be written is made high, and those of the other rows are made low, and the program interconnect line PRGp of each column is made high or low according to data to be written, thereby starting writing. The above procedure is repeated for each row, whereby it is possible to perform program operations of the program sections 55 of all the CAM memory cells CMC in the memory cell array 41.

<Latch Operation>

Next, a latch operation for causing the data holding section 51 of the CAM memory cell CMC to hold data written to the electrical fuse (PMOS5-1) will be described below.

First, the voltage level of the internal power source VDD is set at the VSS level. Subsequently, all the program interconnect lines VBP and DCp are made high, and the program interconnect line PRGp is made low.

(Case (a): when High is Latched at Node D)

In the above biased relationship, when the gate insulating film of the electrical fuse (PMOS5-1) is broken, and the electrical fuse (PMOS5-1) is in the conduction state (when data "0" is written thereto), the voltage of node D is determined by the voltages of the program interconnect line VBP and the VSS level, and the potentiometric voltage division of the transistors PMOS5-1, NMOS5-1, and NMOS5-2 arranged between the program interconnect line VBP and the VSS level. As a result, the voltage to be applied to node D can be made higher the VSS level. More practically, at this time, it is desirable that the sizes of the respective transistors be designed in such a manner that the voltage to be applied to node D becomes higher than the threshold voltage (Vth) of the transistor N4 of the data holding section.

In this state, when the voltage of the internal power source VDD is made high (VDD level), in the present case (a), high is latched at node D. After this, the program interconnect lines VBP and DCp are made low.

(Case (b): when Low is Latched at Node D)

On the other hand, in the above biased relationship, when the gate insulating film of the electrical fuse (PMOS5-1) is not broken, and the electrical fuse (PMOS5-1) is in the non-conduction state (when data "1" is written thereto), the potential of node D becomes the VSS level.

In this state, when the voltage of the internal power source VDD is made high (VDD level), in the present case (b), low is latched at node D. Thereafter, the program interconnect lines VBP and DCp are made low.

The above-mentioned latch operations are performed. After this, by using the data (defective address) held in the data holding section 51, a redundancy operation identical with that of the first embodiment is performed.

As described above, with the semiconductor memory device according to this embodiment, at least effects identical with those of the above items (1 and 2) can be obtained.

Furthermore, according to this example, the effect of the following item (3) can be obtained.

(3) Transfer of the defective address is not necessary, which is advantageous to a high-speed operation.

As shown in the figures, the semiconductor memory device according to this example differs from that of the first embodiment in the point that the CAM memory cell CMC is further provided with the program section.

For this reason, it is possible to directly program the defective address in the CAM memory cell CMC. Furthermore, the operation for transferring the defective address from the external metal fuse/electrical fuse of the CAM 13 to the content-addressable memory 13 to be performed immediately after the turning-on of the power which is necessary in the first embodiment is made unnecessary. For this reason, the above fact is advantageous to the high-speed operation.

Comparative Example (Example in which Spare Rows are Provided)

Next, in order to make a comparison with the semiconductor memory devices according to the first and second embodiments, a semiconductor memory device according to the comparison example will be described below with reference to FIGS. 9 and 10. This comparison example is an example in which a memory to be saved is provided with spare rows.

Figure 9:
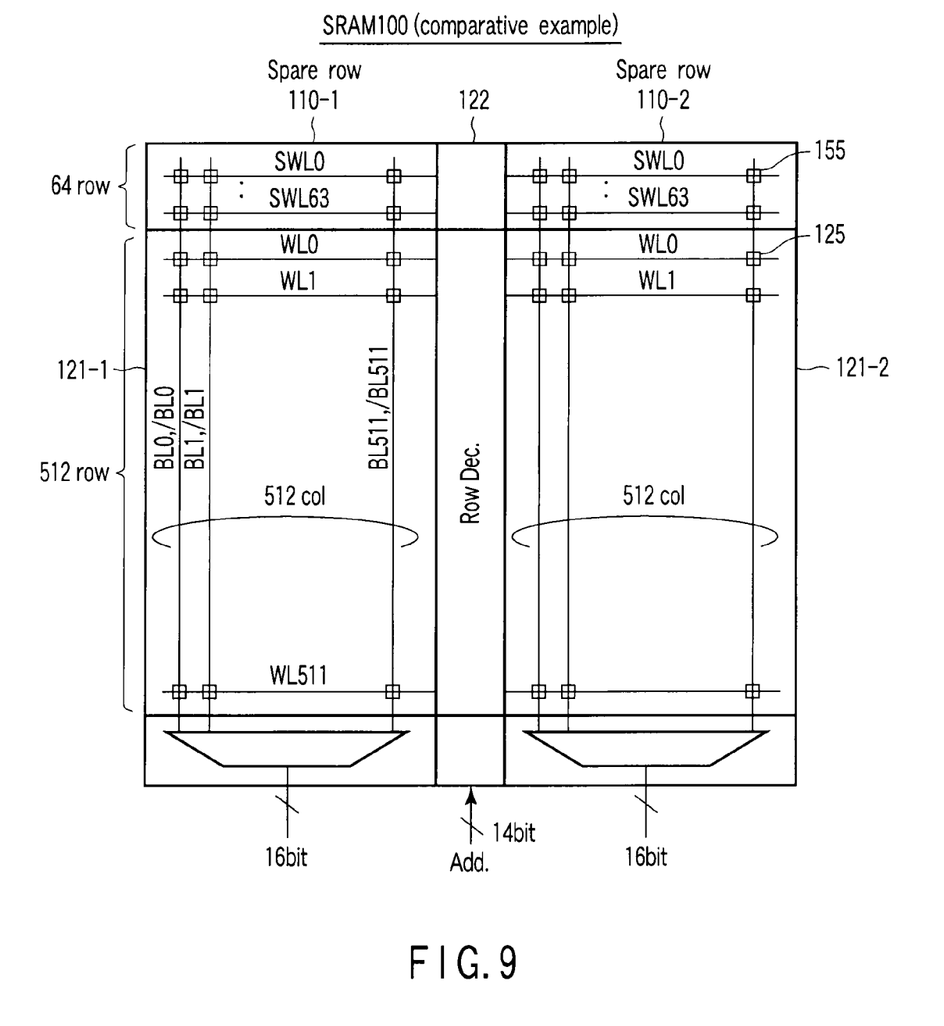
FIG. 9 is a block diagram showing a semiconductor memory device according to a comparative example of the present invention.

FIG. 9 is a block diagram of the semiconductor memory device according to the comparison example, showing an SRAM 100. As shown in FIG. 9, the SRAM 100 according to this comparison example is provided with 64 spare rows 110-1 and 110-2, and memory cell arrays 121-1 and 121-2 each include the capacity of 512 rows.

The array structure is 512 rows×1024 columns, and the word structure is 16 kilowords×32 bits. The 1024 columns deliver or receive data to or from I/O terminals of 32 bits through a 32:1 multiplexer. In this macro, each of row addresses of 9 bits (512 rows=$2^9$) of external input addresses of 14 bits are compared with each of a maximum of 64 sets of addresses of defective rows by an address comparator circuit (not shown) provided in the macro, and when both of them coincide with each other, the corresponding defective word line (any one of WL0 to WL511) is replaced with any one of spare word lines (SWL0 to SWL63), the spare word lines (SWL0 to SWL63) being allocated to the word lines (WL0 to WL511).

Thus, in this structure, 64 spare rows are added to the 512 rows and, hence, as to only the array area, the area increases by 12.5%. Further, the area penalty of the spare rows exceeds 10% with respect the overall memory macro area.

As described above, in the structure according to the comparison example, when high-capacity redundancy is provided, the area is increased. For example, when a case where a defect of a single bit is saved is assumed, 64 spare rows (64×1024=64 Kb) are used to save defective cells of 64 bits, and thus the area efficiency is remarkably low.

This is because the defective word line (any one of WL0 to WL511) of the cell array to be saved is replaced with one spare word line (any one of SWL0 to SWL63) as a unit, i.e., not with one memory cell as a unit, but with one word line (row) as a unit.

Thus, not all the cells in the defective word line (any one of WL0 to WL511) to be replaced are defective, and hence even cells which do not originally need to be replaced are replaced.

Figure 10:
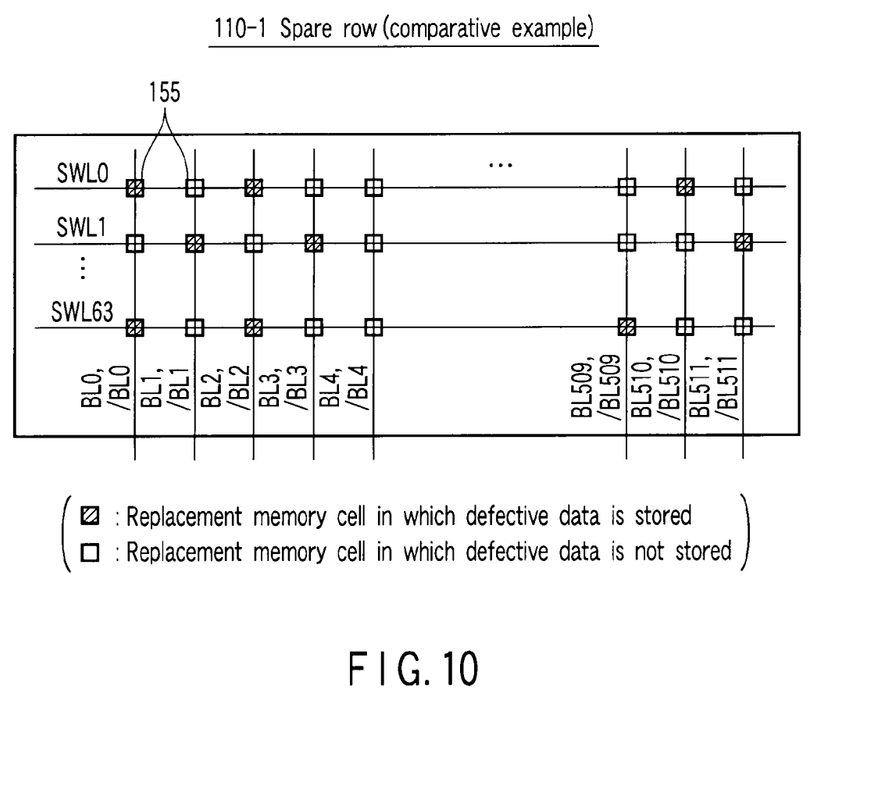
FIG. 10 is a block diagram showing a spare row according to the comparative example.

For example, as shown in FIG. 10, defective data items are not stored in all the replacement memory cells 155 arranged on the spare row 110-1. Thus, all the cells connected to the defective word line (any one of WL0 to WL511) are replaced, and replacement cannot be performed in units of one word (cell).

Furthermore, the spare rows 110-1 and 110-2, and the address comparator circuit (not shown) are provided in the SRAM macro 100 as hard IP on the layout level. For this reason, once the SRAM macro 100 is designed, when it becomes necessary to obtain a macro in which the number of spare rows is reduced, and the area is also reduced due to an improvement in the manufacturing level of the factory, the period of time needed to redesign the spare rows is long.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor memory device comprising:
a first memory to which a first address and first input data are input, and which outputs first output data;
a content-addressable memory to which the first address is input as a search address, and which performs a search to determine whether or not the first address and a defective address coincide with each other and, when the first address and the defective address coincide with each other, outputs a second address and a control signal;
a second memory which, when the second address is input thereto, outputs redundant data corresponding to the second address; and
a multiplexer which, when the control signal is input thereto, switches the output data from the first output data to the redundant data, and outputs the redundant data to an input/output terminal.

2. The device according to claim 1, wherein the first memory is an SRAM provided with a plurality of SRAM cells arranged at intersection positions of a plurality of word lines and a plurality of bit lines in a matrix form.

3. The device according to claim 1, wherein the second memory is an SRAM provided with a plurality of SRAM cells arranged at intersection positions of a plurality of word lines and a plurality of bit lines in a matrix form.

4. The device according to claim 1, wherein the content-addressable memory is a CAM provided with a plurality of CAM memory cells arranged at intersection positions of a plurality of word lines and a plurality of bit lines in a matrix form.

5. The device according to claim 4, wherein the CAM memory cell is provided with a data holding section for holding the defective address, and a comparison section for performing comparison to determine whether or not the search address input thereto from a search line coincides with a defective address held in the data holding section.

6. The device according to claim 5, wherein the data holding section is arranged at an intersection position of a word line and a bit line, and is provided with the same configuration as an SRAM cell.

7. The device according to claim 5, wherein the comparison section includes:
a first transistor a control terminal of which is connected to the data holding section, and one end of a current pathway of which is connected to a match line;
a second transistor a control terminal of which is connected to a first search line, one end of a current pathway of which is connected to the other end of the current pathway of the first transistor, and the other end of the current pathway of which is connected to a first reference power source;
a third transistor a control terminal of which is connected to the data holding section, and one end of a current pathway of which is connected to the match line; and
a fourth transistor a control terminal of which is connected to a second search line, one end of a current pathway of which is connected to the other end of the current pathway of the third transistor, and the other end of the current pathway of which is connected to the first reference power source.

8. The device according to claim 4, wherein the CAM memory cell is further provided with a program section which stores the defective address stored in the CAM memory cell, and stores the defective address in the CAM memory cell after turning-on of the power.

9. The device according to claim 8, wherein the program section includes:
an electrical fuse one end of which is connected to a first program interconnect line;
a protection transistor a gate of which is connected to a program node, and one end of a current pathway of which is connected to the other end of the electrical fuse;
a second transistor a gate of which is connected to a second program interconnect line, one end of a current pathway of which is connected to the other end of the current pathway of the protection transistor, and the other end of the current pathway of which is connected to the first reference power source; and
a third transistor a gate of which is connected to a third program interconnect line, one end of a current pathway of which is connected to the other end of the current pathway of the protection transistor, and the other end of the current pathway of which is connected to the first reference power source.

10. The device according to claim 9, wherein the electrical fuse is a gate insulating film breakdown type electrical fuse a gate of which is connected to the one end of the current pathway of the protection transistor, and one end and the other end of a current pathway of which are connected to the first program interconnect line.

11. The device according to claim 1, wherein the first memory is not provided with spare rows.

12. The device according to claim 1, wherein the first memory includes:
first and second memory cell arrays each of which is provided with a plurality of memory cells arranged in a matrix form;
a row decoder for decoding addresses input to the first and second memory cell arrays; and
first and second multiplexers through which the input/output data of the first and second memory cell arrays are passed.

13. A redundancy method of a semiconductor memory device comprising:
inputting a first address to a content-addressable memory as a search address;
causing the content-addressable memory to perform a search to determine whether or not the input search address and a defective word address coincide with each other;
causing the content-addressable memory, when the input search address and the defective word address coincide with each other, to output a second address to a second memory as an encoded address, and output a control signal to a multiplexer;
causing the second memory to output redundant data corresponding to the input second address to the multiplexer; and
causing the multiplexer which has received the control signal to switch the output data from first output data to the redundant data, and output the redundant data to an input/output terminal.

14. The redundancy method according to claim 13, wherein each of a first memory and the second memory is an SRAM provided with a plurality of SRAM cells arranged at intersection positions of a plurality of word lines and a plurality of bit lines in a matrix form.

15. The redundancy method according to claim 13, wherein the content-addressable memory is a CAM provided with a plurality of CAM memory cells arranged at intersection positions of a plurality of word lines and a plurality of bit lines in a matrix form.

16. The redundancy method according to claim 15, wherein the CAM memory cell is provided with a data holding section for holding the defective address, and a comparison section for performing comparison to determine whether or not the search address input thereto from a search line coincides with a defective address held in the data holding section.

17. The redundancy method according to claim 15, further comprising programming the defective address in a program section in the CAM memory cell before inputting the search address to the content-addressable memory.

18. The redundancy method according to claim 17, further comprising causing the data holding section to latch the defective data after programming the defective address in the program section.

19. The redundancy method according to claim 13, wherein the first memory is not provided with spare rows.

20. The redundancy method according to claim 13, wherein the first memory includes:
  first and second memory cell arrays each of which is provided with a plurality of memory cells arranged in a matrix form;
  a row decoder for decoding addresses input to the first and second memory cell arrays; and
  first and second multiplexers through which the input/output data of the first and second memory cell arrays are passed.

* * * * *